(12) United States Patent
Warner et al.

(10) Patent No.: US 6,215,672 B1
(45) Date of Patent: Apr. 10, 2001

(54) MOUNTING STRUCTURE FOR AN ACCELERATION SENSOR

(75) Inventors: Michael D. Warner, Brooklyn, MI (US); Frederick O. Schipp, Jasper, IN (US)

(73) Assignee: Kelsey-Hayes Company, Livonia, MI (US)

( * ) Notice: Subject to any disclaimer, the term of this patent is extended or adjusted under 35 U.S.C. 154(b) by 0 days.

(21) Appl. No.: 09/410,983

(22) Filed: Oct. 1, 1999

Related U.S. Application Data

(63) Continuation of application No. PCT/US98/06356, filed on Apr. 1, 1998.
(60) Provisional application No. 60/042,290, filed on Apr. 1, 1997.

(51) Int. Cl.[7] .................................................. H01R 23/68
(52) U.S. Cl. .................. 361/785; 73/514.01; 73/514.26; 361/809
(58) Field of Search ...................................... 361/752, 755, 361/784, 785, 807, 809, 810; 73/514.01, 514.16, 514.19, 514.26, 514.35, 652, 655

(56) References Cited

U.S. PATENT DOCUMENTS

| | | | |
|---|---|---|---|
| 4,462,254 | * | 7/1984 | Rider . |
| 4,895,021 | | 1/1990 | Ishizeki . |
| 5,013,909 | * | 5/1991 | Sondergeld . |
| 5,253,526 | * | 10/1993 | Omura . |
| 5,446,626 | | 8/1995 | Dittman et al. . |
| 5,528,936 | * | 6/1996 | Falk . |
| 5,608,631 | | 3/1997 | Tsutsumi et al. . |
| 5,760,938 | * | 6/1998 | Hodge . |
| 5,824,902 | * | 10/1998 | Corkum . |
| 5,831,164 | * | 11/1998 | Reddi . |

* cited by examiner

*Primary Examiner*—Gerald Tolin
(74) *Attorney, Agent, or Firm*—MacMillan, Sobanski & Todd, LLC

(57) ABSTRACT

Secondary circuit board which carries an acceleration sensor is mounted upon a primary circuit board in an anti-lock brake system control unit. The secondary circuit board is mounted at an angle to the primary circuit board and the acceleration sensor is mounted at an angle relative to the secondary circuit board to align a sensing element contained in the acceleration sensor perpendicular to a direction of vehicle travel.

12 Claims, 6 Drawing Sheets

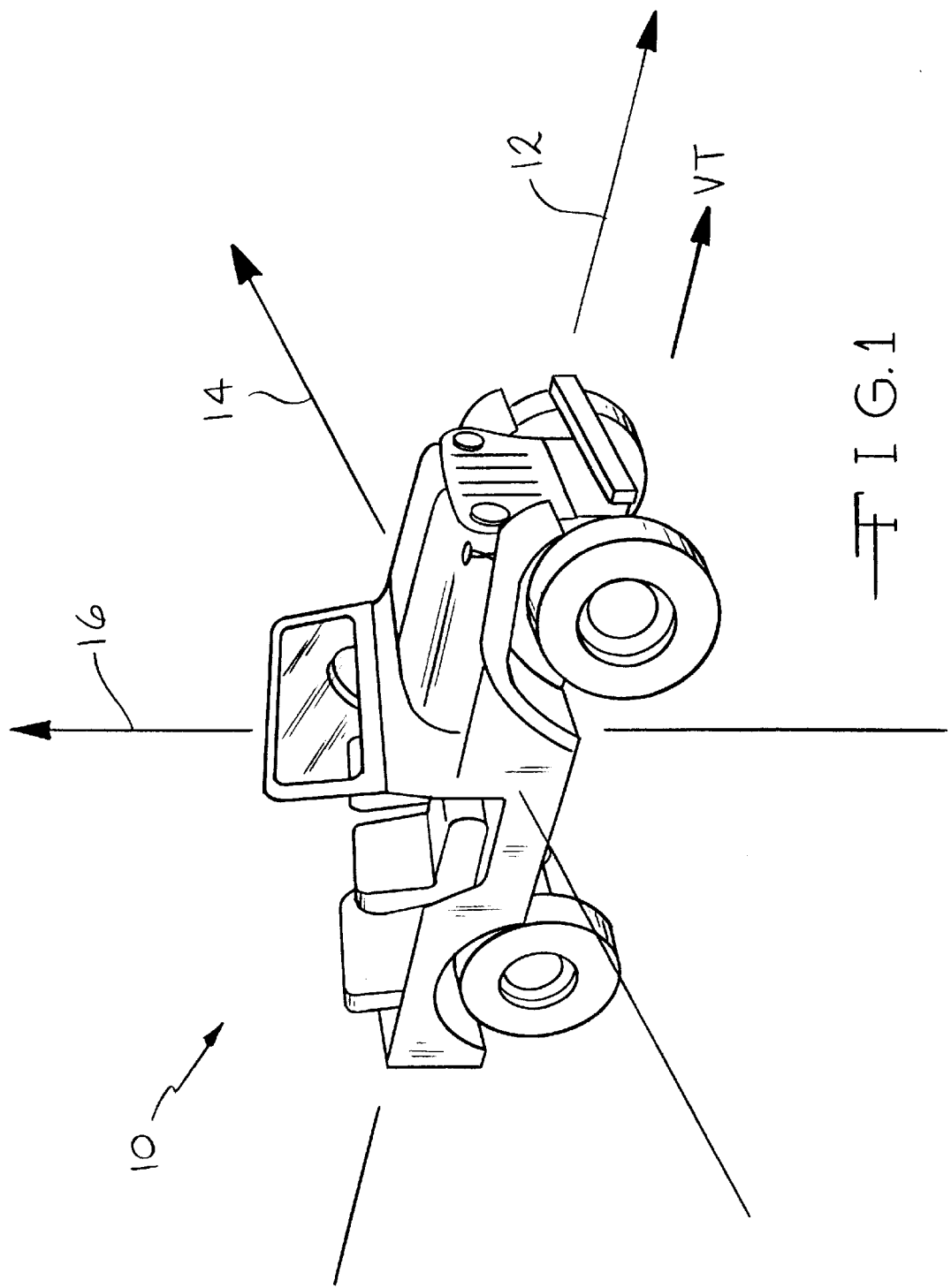

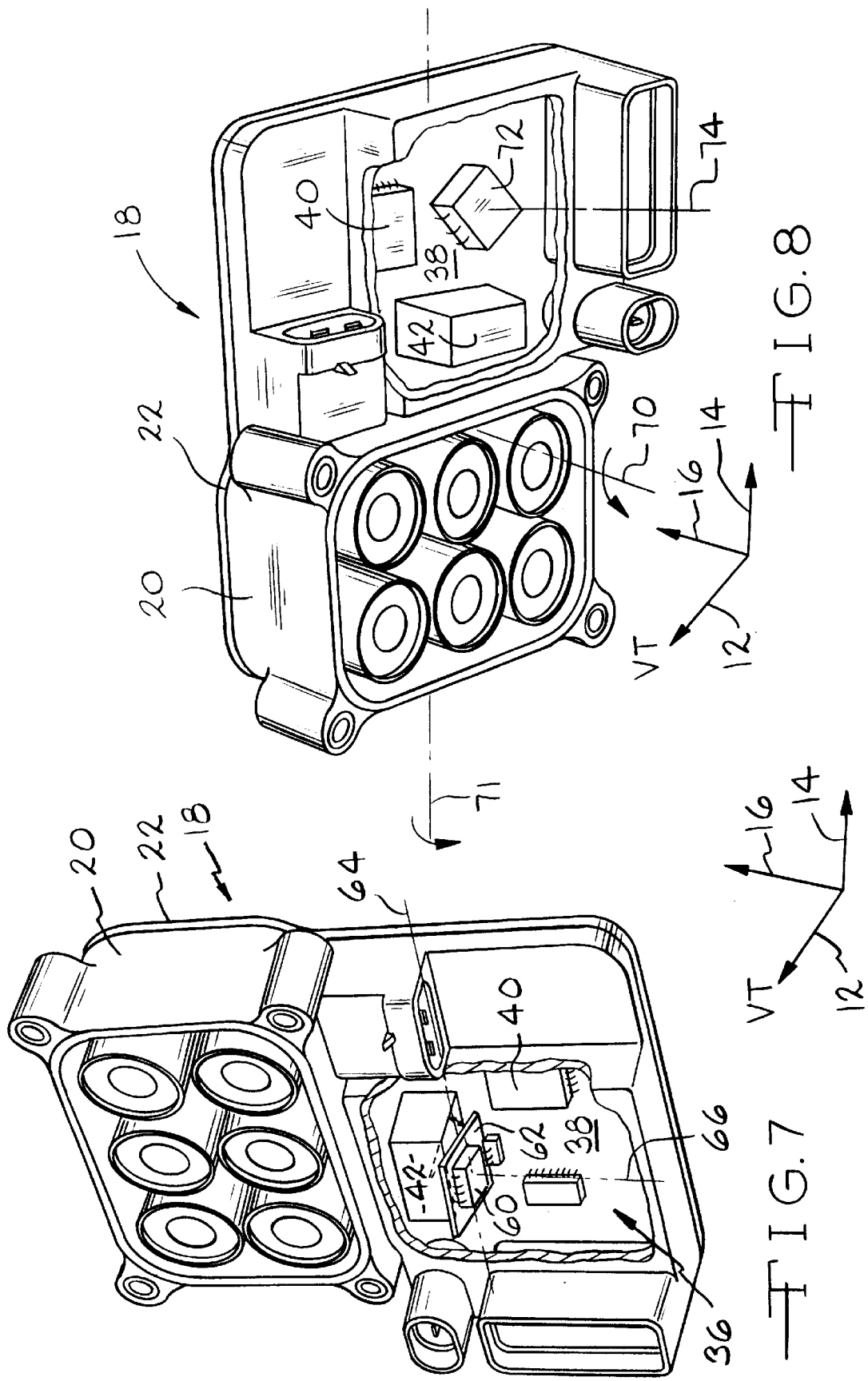

MOUNTING STRUCTURE FOR AN ACCELERATION SENSOR

CROSS REFERENCE TO RELATED APPLICATIONS

This application claims the benefit of U.S. Provisional Patent Application No. 60/042,290, filed Apr. 1, 1997, and is a continuation of International Patent Application No. PCT/US98/06356 filed Apr. 1, 1998.

BACKGROUND OF THE INVENTION

This invention relates in general to sensors for anti-lock brake systems, and in particular to a structure for mounting an acceleration sensor within an anti-lock brake system control module.

An anti-lock brake system (ABS) is often included as standard equipment on new vehicles. When actuated, the ABS is operative to control the operation of some or all of the vehicle wheel brakes. A typical ABS includes a plurality of solenoid valves mounted within a control valve body and connected to the vehicle hydraulic brake system. Usually, a separate hydraulic source, such as a motor driven pump, is included in the ABS for reapplying hydraulic pressure to the controlled wheel brakes during an ABS braking cycle. The pump is typically included within the control valve body while the pump motor is mounted upon the exterior of the control valve body.

An ABS further includes an electronic control module which has a microprocessor. The control module is electrically coupled to the pump motor, a plurality of solenoid coils associated with the solenoid valves and wheel speed sensors for monitoring the speed and deceleration of the controlled wheels. The control module is typically mounted upon the control valve body to form a compact unit which is often referred to as an ABS electro-hydraulic control unit.

During vehicle operation, the microprocessor in the ABS control module continuously receives speed signals from the wheel speed sensors. The microprocessor monitors the speed signals for potential wheel lock-up conditions. When the vehicle brakes are applied and the microprocessor senses an impending wheel lock-up condition, the microprocessor is operative to actuate the pump motor and selectively operate the solenoid valves in the control unit to cyclically relieve and reapply hydraulic pressure to the controlled wheel brakes. The hydraulic pressure applied to the controlled wheel brakes is adjusted by the operation of the solenoid valves to limit wheel slippage to a safe level while continuing to produce adequate brake torque to decelerate the vehicle as desired by the driver.

It is known to include an acceleration sensor, commonly known as a "g-sensor", in an ABS. Acceleration sensors measure the movement of a seismic mass in an acceleration field. A spring element converts the force due to acceleration into a measurable deflection. Acceleration sensors typically include a sensing element in the form of a pendulum beam, which combines the spring element and the seismic mass into one flexible structure. The pendulum beam has a fixed end and a movable end. An acceleration or deceleration causes a deflection of the movable end of the pendulum beam about the fixed end.

The g-sensor measures the longitudinal acceleration or deceleration of the vehicle and sends a corresponding signal to the microprocessor in the ABS control module. The acceleration or deceleration signal from the g-sensor is independent of the speed signals from the wheel speed sensors. This input is beneficial in situations such as skidding of all four wheels of a four-wheel drive vehicle, indicating a low or zero wheel speed signal while the vehicle may actually be moving. The g-sensor senses this motion and provides an input to the ABS.

One type of g-sensor commonly used in ABS is a capacitive g-sensor. Capacitive g-sensors measure the change in capacitance between two electrodes when the physical separation of the electrodes changes in response to applied acceleration. One electrode is a pendulum beam, usually formed from silicon. The fixed end of the silicon beam is typically bonded to a rugged ceramic substrate. The silicon beam acts as one parallel plate in a capacitor. A thin film electrode on the substrate provides a second capacitor plate. The g-sensor also usually includes an electronic conditioning circuit which converts the capacitance determined by the separation of the electrodes into an analog output voltage. Capacitive g-sensors provide low temperature sensitivity and a large signal-to-noise ratio.

An acceleration or deceleration causes a deflection of the silicon beam about its fixed end, which causes a change in an sensor capacitance. The change in capacitance causes a corresponding change in the voltage produced by the conditioning circuit. Thus, the g-sensor measures the longitudinal acceleration or deceleration of the vehicle and generates a corresponding analog voltage signal which is proportional to the acceleration. The sensor output voltage is applied to an analog sensor input port on the microprocessor in the ABS control module. The microprocessor determines a vehicle reference speed by numerically integrating the g-sensor signal for comparison to the signals generated by the wheel speed sensors.

SUMMARY

This invention relates to a structure for mounting an acceleration sensor within an anti-lock brake system control module.

As described above, it is known to include an acceleration sensor, commonly known as a "g-sensor", in an ABS. For accurate measurements, the silicon beam in the g-sensor has to be oriented so that it can be deflected about one end in a horizontal direction by acceleration forces. Accordingly, the silicon beam is oriented to lie in a vertical plane perpendicular to the direction of vehicle travel, which also maximizes the sensitivity of the sensor to the acceleration forces. It is not necessary for an edge of the beam to be horizontal or vertical, so long as a face of the beam is perpendicular to the direction of travel. In the past, the g-sensor was packaged in a housing separate from the ABS control module. Typically, depending upon the configuration of the g-sensor package, the g-sensor has been mounted on a horizontal or vertical surface near the center of gravity of the vehicle. Mounting the g-sensor on a horizontal or vertical surface allows a relatively easy orientation of the silicon beam for accurate acceleration force measurements. However, mounting the g-sensor near the center of gravity of the vehicle requires additional packaging for the g-sensor and additional electrical cables and connectors to connect the g-sensor to the ABS control module. These additional components increase the cost and complexity of the vehicle. Thus, it would be desirable to provide a g-sensor for use with an ABS without significantly increasing the cost or complexity of the vehicle.

The present invention is directed toward a control module which includes a housing adapted to be mounted upon a vehicle having a primary axis. The control module also includes a circuit board disposed within the housing and an acceleration sensor mounted upon the circuit board. The acceleration sensor includes an acceleration measuring element. The acceleration sensor is mounted upon the circuit board with the measuring element lying in a plane which is perpendicular to the vehicle primary axis.

The invention also contemplates that the circuit board is a primary circuit board and that the acceleration sensor is mounted upon a secondary circuit board which is mounted upon the primary circuit board. Additionally, the secondary circuit board is mounted upon the primary circuit board at a predetermined angle. The secondary circuit board can be perpendicular to the primary circuit board with the secondary circuit board rotated relative to the primary circuit board about a first axis which is perpendicular to said primary circuit board. Alternately, the secondary circuit board can be rotated relative to said primary circuit board about aother axis which is parallel to a surface of said primary circuit board. For both alternatives, acceleration sensor is rotated relative to the secondary circuit board about a second axis which is perpendicular to the secondary circuit board.

It is contemplated that the primary vehicle axis can be a longitudinal, lateral or vertical vehicle axis and the control module can be included in an anti-lock brake system or a traction control system.

The invention also is directed toward a process for producing a control module which includes a g-sensor and is adapted to be mounted in a vehicle having a primary axis. The process includes providing a circuit board. An acceleration sensor having a sensing element is rotated about a first axis which is perpendicular to the circuit board such that, when the control module is mounted in the vehicle, the sensing element will be perpendicular to the primary axis of the vehicle. The sensor is then attached to the circuit board and the circuit board installed in a housing.

The process also can include rotating the circuit board and sensor about a second axis relative to a primary circuit board and attaching the circuit board and sensor to the primary circuit board such that, when the control module is mounted in the vehicle, the sensing element will be perpendicular to the primary vehicle axis. The invention contemplates that the second axis can be perpendicular to the primary circuit board or parallel to a surface of the primary circuit board.

Various objects and advantages of this invention will become apparent to those skilled in the art from the following detailed description of the preferred embodiment, when read in light of the accompanying drawings.

BRIEF DESCRIPTION OF THE DRAWINGS

FIG. 1 is a perspective view of a four-wheel drive vehicle.

FIG. 7 is a perspective view of an alternate embodiment of the g-sensor mounting structure shown in FIG. 3.

FIG. 8 is a perspective view of another alternate embodiment of the g-sensor mounting structure shown in FIG. 3.

DETAILED DESCRIPTION OF THE PREFERRED EMBODIMENT

Figure 3:
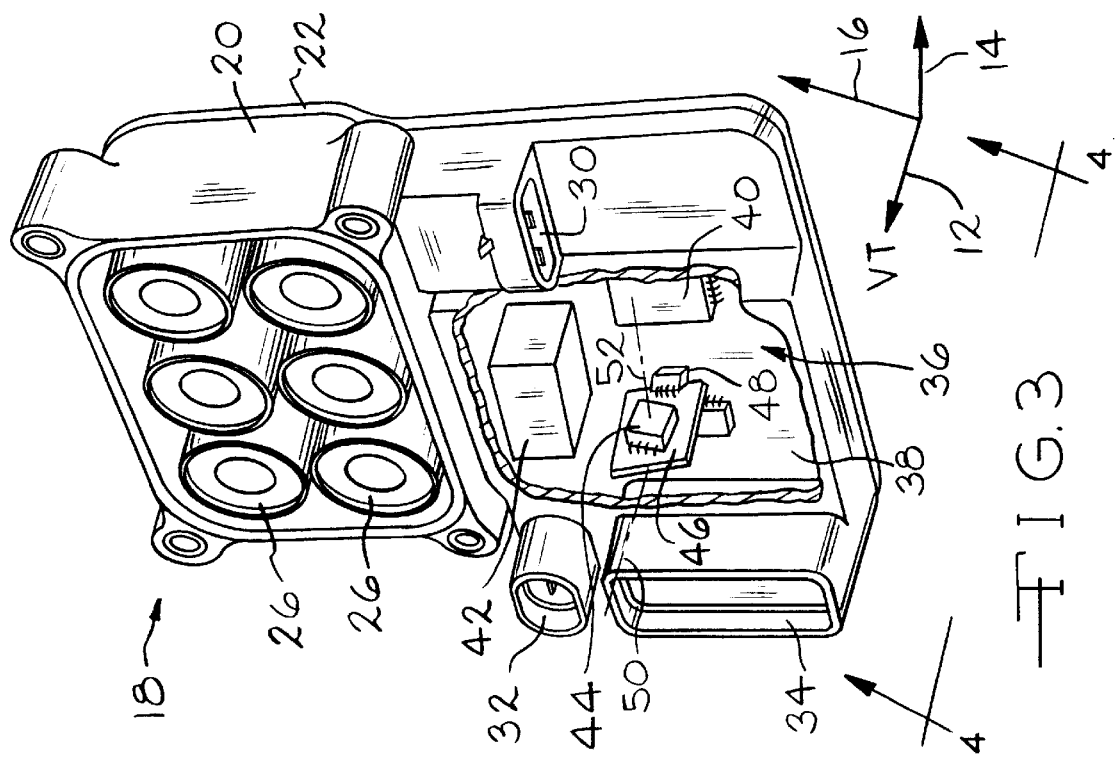
FIG. 3 is a perspective cut-away view of a portion of the ABS electro-hydraulic control unit shown in FIG. 2, which includes a g-sensor mounting structure in accordance with the invention.

Referring now to the drawings, there is shown in FIG. 1 an example of a four-wheel drive vehicle 10. The vehicle 10 has a set of orthogonal axes which include a longitudinal axis 12, a lateral axis 14 and a vertical axis 16. The longitudinal axis 12 and lateral axis 14 are perpendicular and define a horizontal plane. The vertical axis 16 is perpendicular to the horizontal plane. The normal direction of travel of the vehicle 10 is along the longitudinal axis 12, as indicated by the small arrow labeled "VT" in FIG. 1. The vertical axis 16 and the lateral axis 14 define a vertical plane which is perpendicular to the direction of travel VT.

Figure 2:
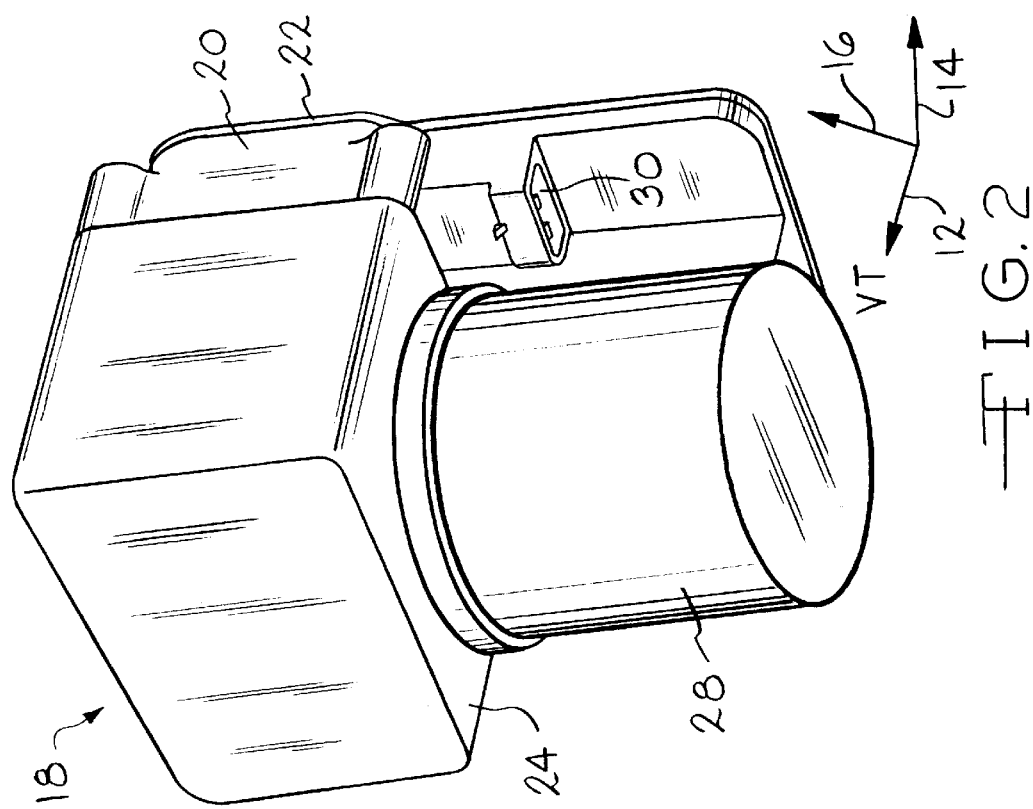
FIG. 2 is a perspective view of an ABS electro-hydraulic control unit installed in the vehicle shown in FIG. 1.

The vehicle 10 is equipped with an ABS. The ABS includes an electro-hydraulic control unit 18 which is illustrated in FIGS. 2 and 3 The ABS control unit 18 has a housing 20 which is formed of plastic or other suitable material. A cover 22 is secured to the housing 20. The control unit 18 also includes a control valve body 24. A plurality of solenoid valves and a motor driven pump (not shown) are mounted within the control valve body 24. As shown in a cut-away view of the control unit 18 in FIG. 3, each of the solenoid valves has an associated solenoid coil 26 which is carried by the housing 20. A pump motor 28 is mounted upon the exterior of the control valve body 24. The ABS electro-hydraulic control unit 18 has electrical connectors, including a power input connector 30 for providing electrical power to the control unit. Additionally, a pump motor connector 32 transmits electrical power to the pump motor 28, while a sensor connector 34 receives speed signals from the wheel speed sensors. The control unit 18 includes conventional devices (not shown) for mounting the unit 18 upon the vehicle 10.

An electronic control module 36 is disposed within a portion of the housing 20. A primary printed circuit board or "mother board" 38 is mounted within the ABS control module 36. The mother board 38 has electrical traces (not shown) deposited upon its surface. A microprocessor 40 is mounted upon the mother board 38. The microprocessor 40 receives signals from the ABS wheel speed sensors (not shown). Upon sensing a potential wheel lock-up condition, the microprocessor 40 is operative to actuate the pump motor 28 and selectively operate the solenoid valves to correct the lock-up condition. A power relay 42 also is mounted upon the mother board 38 to control the flow of power to the ABS components. Other electronic components are attached by conventional methods to the mother board 38.

The present invention contemplates a structure for mounting a g-sensor 44 upon the mother board 38 within the ABS control module 36. Mounting the g-sensor 44 within the ABS control module 36 instead of at the center of gravity of the vehicle 10 eliminates the need for additional packaging, electrical cables and connectors. As a result, the cost and complexity of the ABS is reduced compared to an ABS with a conventional mounting of a g-sensor at the vehicle center of gravity. Eliminating the additional electrical cables and connectors also can improve the reliability of the g-sensor and the ABS.

The ABS electro-hydraulic control unit 18 is mounted on the vehicle 10 at a location suitable for connection to the vehicle hydraulic brake system and which also is accessible for servicing. Consequently, the ABS control unit 18 is often mounted upon a surface of the vehicle which is angled relative to the vehicle's orthogonal axes. For example, in the preferred embodiment, the ABS control unit 18 is mounted in a wheel well of the vehicle 10. Because of the shape of the wheel well, the control unit 18 and, consequently, the mother board 38 in the control module 36 are rotated relative to the orthogonal axes 12, 14 and 16 of the vehicle 10, which are included in FIGS. 2 and 3 for reference.

As described above, for accurate measurements with the g-sensor 44 illustrated in FIGS. 2 and 3, the sensing element, or silicon beam, of the sensor should be oriented so that it can be deflected about one end in a horizontal direction. Accordingly, the g-sensor 44 should be mounted in a vertical plane. Additionally, the silicon beam should be oriented perpendicular to the direction of vehicle travel, VT. Thus, the sensor should be mounted with its silicon beam lying in the vertical plane defined by the vehicle's lateral and vertical axes 14 and 16, which is perpendicular to the longitudinal axis 12 of the vehicle 10. However, for the control unit 18 shown in FIGS. 2 and 3, conventional mounting methods, which would attach the g-sensor 44 directly to the mother board 38, would result in the silicon beam being rotated out of the vertical plane defined by the vehicle's lateral and vertical axes 14 and 16. Also, the silicon beam would not be perpendicular to the direction of travel VT. Thus, a conventionally mounted sensor would be in an unsuitable orientation for accurate acceleration measurements.

The present invention overcomes this difficulty by providing a mounting structure in which the positioning of the g-sensor relative to the mother board 38 can be adjusted by rotating the g-sensor 44 about two perpendicular axes. The number of degrees of spatial freedom available for an object is one greater than the number of axes about which the object can be rotated. Thus, the mounting structure contemplated by the invention provides up to three degrees of freedom for positioning the g-sensor within the ABS control module 36. Since the orientation of the mounting structure can be described relative to the three orthogonal axes 12, 14 and 16 of the vehicle 10, the mounting structure allows an orientation of the g-sensor 44 which will compensate for any orientation of the ABS control module 36 upon the vehicle 10.

Figure 4:
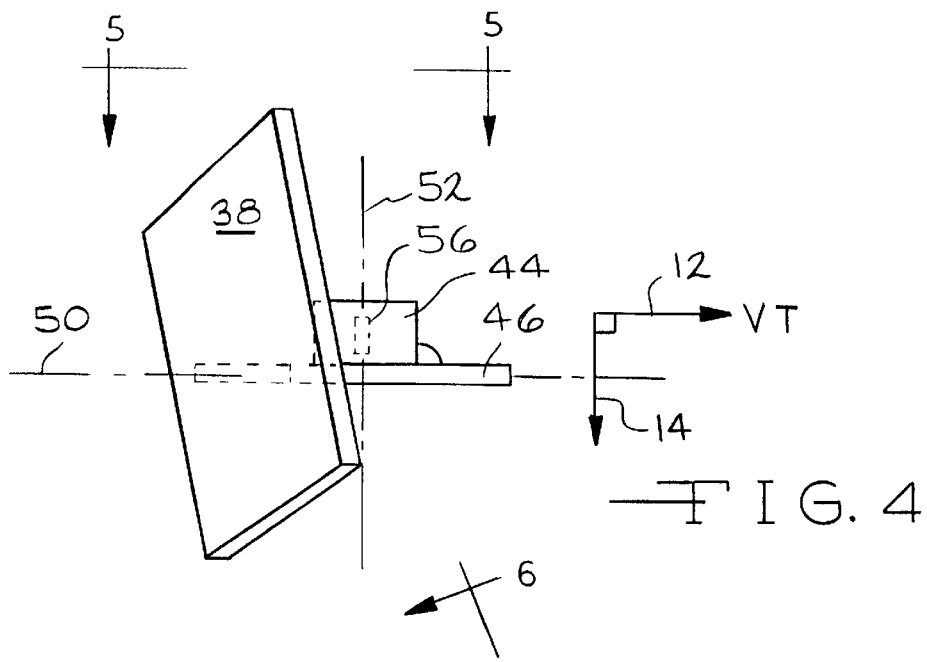
FIG. 4 is an enlarged view of the g-sensor mounting structure shown in FIG. 3.
Figure 5:
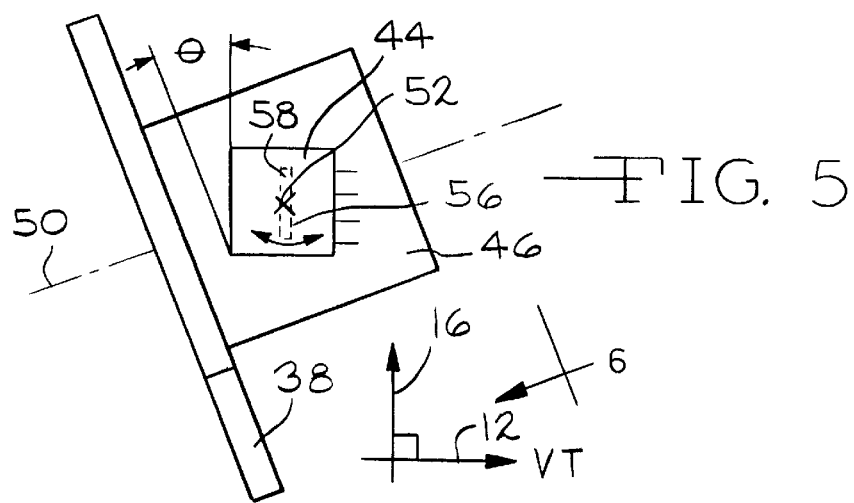
FIG. 5 is a plan view of the g-sensor mounting structure shown in FIG. 4.
Figure 6:
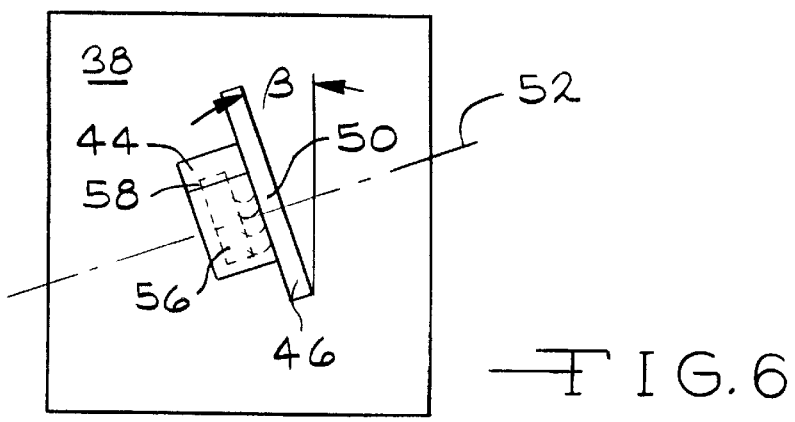
FIG. 6 is a plan view of the circuit board shown in FIG. 4.

In the example illustrated in FIGS. 3 through 6, the g-sensor 44 is mounted on a secondary printed circuit board or "daughter board" 46 in the ABS control module 36. The daughter board 46 is mounted upon the mother board 38 in the ABS control module 36. The daughter board 46 is connected to the mother board 38 by an electrical connector 48. As best seen in FIGS. 4 through 6, in the preferred embodiment, the daughter board 46 is perpendicular to the mother board 36. For simplicity, the mother board 36 is reduced in size and the other electronic components which are mounted upon the mother board 36 have been omitted in FIGS. 4 through 6.

The present invention contemplates that the daughter board 46 can be rotated on the mother board 38 about a first axis of rotation 50 which passes though the center of the daughter board 46 and is perpendicular to the mother board 38. As shown in FIG. 6, the daughter board is rotated about the first axis of rotation 50 by an angle equal to β relative to an edge of the mother board 38. The invention further contemplates that the g-sensor 44 can be rotated on the daughter board 46 about a second axis of rotation 52 which passes through the center of the g-sensor 44 and is perpendicular to the daughter board 46. Accordingly, the second axis of rotation 52 also is perpendicular to the first axis of rotation 50. As shown in FIG. 5, the g-sensor 44 is rotated about the second axis of rotation 52 by an angle equal to θ relative to an edge of the daughter board 46.

As shown in FIGS. 4 through 6, the g-sensor 44 includes a sensing element 56 in the form of a silicon beam. The silicon beam 56 has a fixed end 58. By mounting the g-sensor 44 as described above, the silicon beam 56 is oriented so that it can be deflected about the fixed end 58 in a horizontal direction, as shown in FIG. 5 by the curved directional arrows at the movable end of the beam 56. Also, as shown in FIGS. 4 and 5, the silicon beam 56 has a face which is oriented perpendicular to the direction of vehicle travel VT (i.e., the longitudinal axis 12 of the vehicle). Accordingly, the silicon beam 56 lies in a vertical plane defined by the vehicle's lateral and vertical axes 14 and 16. For the preferred embodiment of the mounting structure, the daughter board 46 lies in a vertical plane defined by the vehicle's longitudinal and vertical axes 12 and 16. Accordingly, the plane of the daughter board 46 is perpendicular to the plane of the g-sensor beam 56. As shown in FIGS. 4 and 5, the long edges of the silicon beam 56 are vertical while the short edges of the beam 56 are horizontal. However, it will be appreciated that the invention can also be practiced with the silicon beam 56, and, consequently, the g-sensor 44, rotated within the vertical plane defined by the vehicle's lateral and vertical axes 14 and 16 (not shown). For such a case, the face of the sensor beam 56 will still be perpendicular to the direction of travel VT, but the edges of the beam 56 will no longer be vertical and horizontal.

Because the two perpendicular axes of rotation 50 and 52 are sufficient to define the possible three degrees of freedom for the g-sensor 44, the rotation of the g-sensor about both the first and second axes of rotation 50 and 52 compensates for any spatial orientation of the ABS control unit 18 upon the vehicle 10 relative to the vehicle axes 12, 14 and 16. Thus, the mounting structure of the invention provides for accurate measurements by the g-sensor independently from the mounting of the ABS control unit 18 and control module 36 upon the vehicle 10.

An alternate embodiment of a mounting structure for a g-sensor 60 according to the invention is illustrated in FIG. 7. Components in FIG. 7 which are similar to components shown in the preceding figures have the same numerical designators. A set of vehicle axes 12, 14 and 16 are included in FIG. 7 to orient the control unit 18 relative to the vehicle 10. In the alternate embodiment, a g-sensor 60 is again mounted upon a daughter board 62; however the daughter board is rotated about a first axis 64 which passes through the center of the daughter board 62 and is parallel to the surface of the mother board 38. In FIG. 7, the daughter board 62 is rotated by an angle φ into a horizontal plane as defined by the vehicle longitudinal and lateral axes 12 and 14. As also shown in FIG. 7, the daughter board contacts the relay 42. The invention contemplates securing the daughter board 62 to the relay 42 with an adhesive for enhanced structural strength; however, the contact with and attachment to the relay 42 is optional.

The invention further contemplates rotating the g-sensor 60 about a second axis 66 which passes through the center of the g-sensor 60 and is perpendicular to the daughter board 62. The g-sensor 60 is rotated about the axis 66 to align the silicon beam contained therein perpendicular to the vehicle direction of travel VT. Accordingly, the alternate embodiment provides for rotation of the g-sensor 60 about two perpendicular axes and thus includes three degrees of freedom for spatially orientating the g-sensor 60. While the alternate embodiment has been illustrated and described with the g-sensor 60 mounted upon a horizontal daughter board 62 plane, it will be appreciated that the invention also can be practiced with the g-sensor 60 mounted upon a non-horizontal daughter board (not shown).

A third embodiment of the invention is illustrated in FIG. 8. As before, components in FIG. 8 which are the same as shown in preceding figures have the same numerical designators. In FIG. 8, the entire control unit 18 has been rotated about a first axis of rotation 70, which is perpendicular to the mother board 38, and about a second axis 71, which passes through the plane of the mother board 38. the control unit 18 is rotated about the second axis 71 until the mother board lies in a horizontal plane which is parallel to a plane defined by the longitudinal and lateral axes 12 and 14 of the vehicle 10. The rotation may be accomplished by remounting the control unit at another location on the vehicle 10 or by providing a control unit mounting fixture (not shown). Alternately, the control unit 10 can be redesigned (not shown) such that the mother board 38 is in a horizontal plane within the housing 20. The alternative would allow mounting the control unit in the same location upon the vehicle 10 without requiring a mounting fixture. A g-sensor 72 is mounted directly upon the mother board 38. The g-sensor 72 is rotated about a second axis of rotation 74 which passes through the center of the g-sensor 72 and is perpendicular to the mother board 38. The g-sensor 72 is rotated about the axis 74 to align the silicon beam contained therein perpendicular to the vehicle direction of travel VT. Thus, the third embodiment provides two perpendicular axes of rotation 71 and 74 for the g-sensor 72 while eliminating the daughter board. Accordingly, the sensor 72 has three degrees of freedom for its spatial orientation.

It is contemplated that the g-sensors 44, 60 and 72 are conventional, commercially available devices. Suitable g-sensors are manufactured by Breed Technologies, Inc., and by Texas Instruments. One type of preferred g-sensor is an 8-Pin Dual In-Line Package Accelerometer manufactured by Breed Technologies, Inc.

The invention also contemplates a method for producing a control module which includes a g-sensor. The method is illustrated by the flow chart shown in FIG. 9. In functional block 80, a secondary circuit board is provided. In functional block 81, a g-sensor is rotated about an axis which is perpendicular to the secondary circuit board by a first predetermined angle θ. The g-sensor is attached to the secondary circuit board in functional block 82.

In functional block 83, the secondary circuit board is rotated relative to a primary circuit board. In the preferred embodiment, the secondary circuit board is positioned perpendicular to the primary circuit board and is rotated about an axis which is perpendicular to primary circuit board by a second predetermined angle β. However, the invention also can be practiced by rotating the secondary circuit board about an axis which is parallel to the surface of the primary surface board. The secondary circuit board is attached to the primary circuit board in functional block 84 such that the silicon beam contained in the g-sensor is perpendicular to the vehicle direction of travel VT. Finally, the primary circuit board is mounted in a control unit housing in functional block 85.

Figure 9:
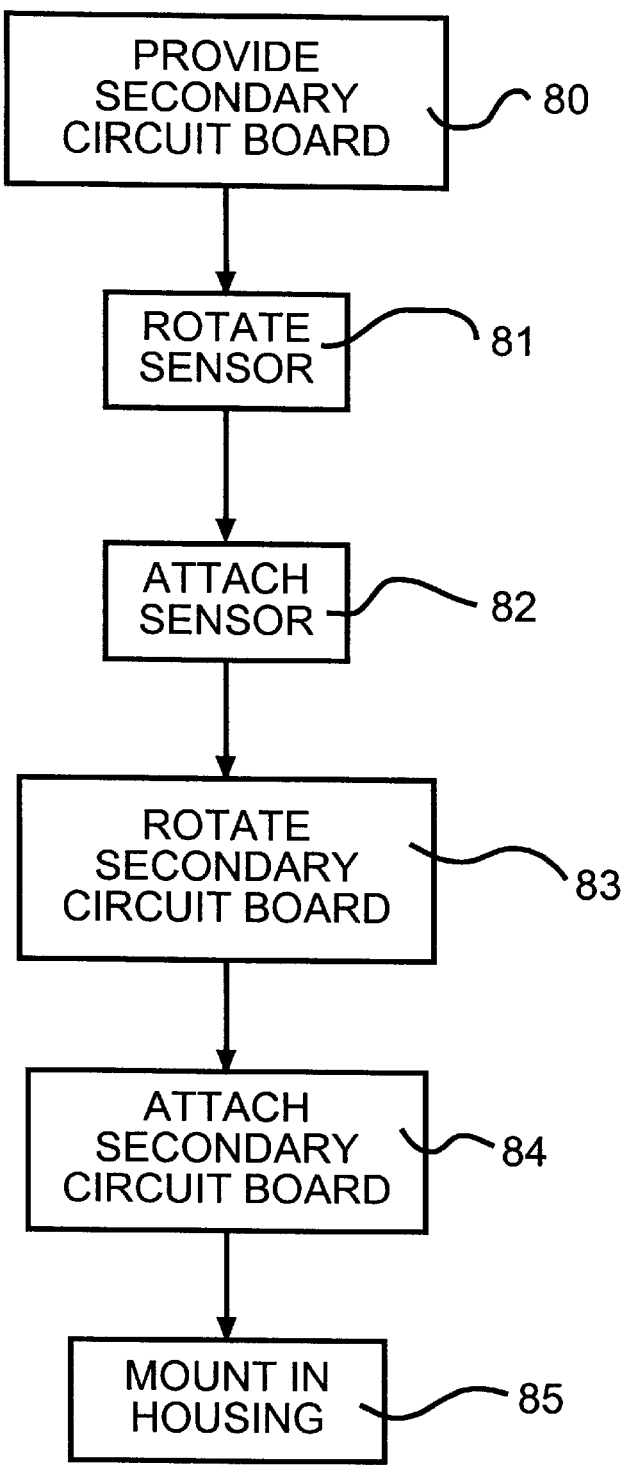
FIG. 9 is a flow chart for a method for producing the control units shown in FIGS. 3 and 7.
Figure 10:
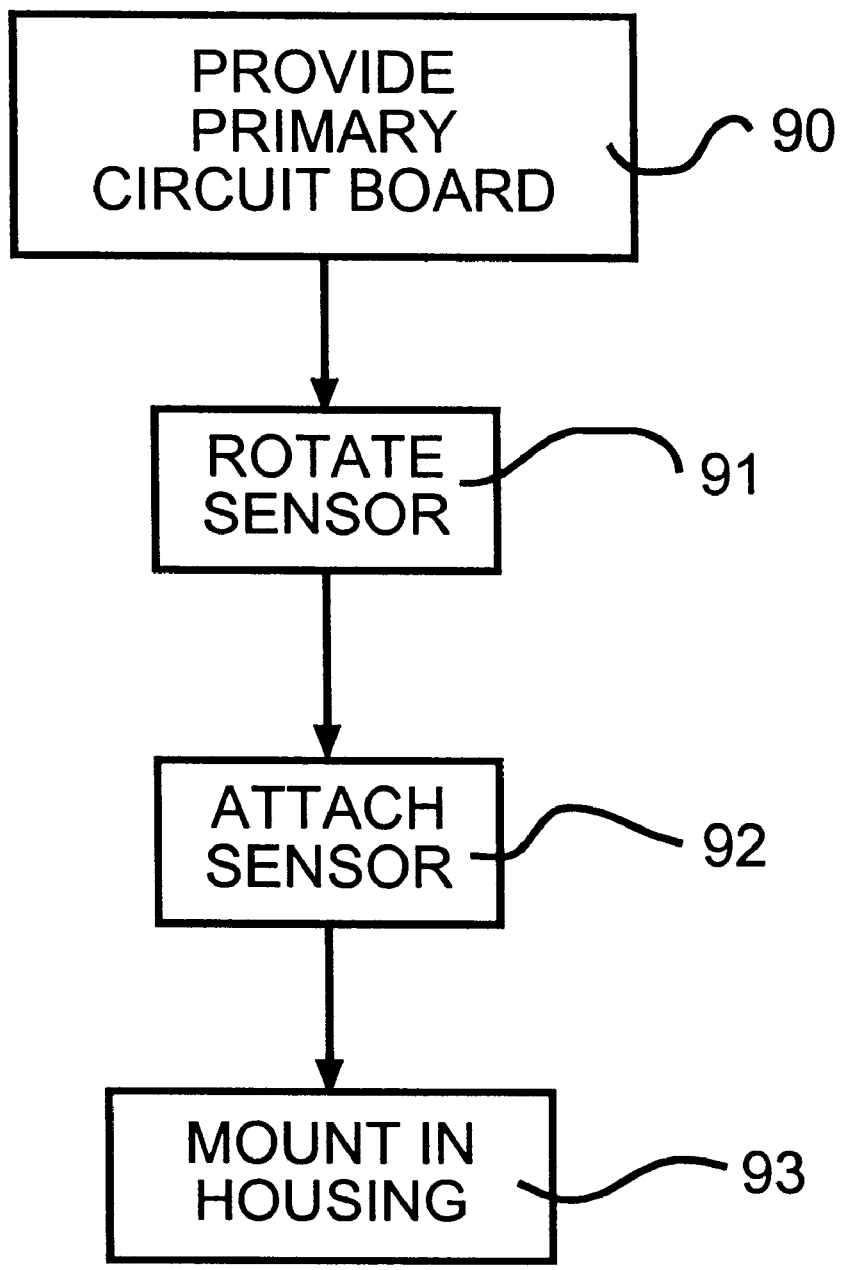
FIG. 10 is a flow chart of an alternate embodiment of the method shown in FIG. 9 which is used to produce the control unit shown in FIG. 8.

The method shown in FIG. 9 and described above is used to produce the control modules illustrated in FIGS. 3 and 7. The invention also contemplates an alternate embodiment of the method for producing which results in the control module illustrated in FIG. 8. The alternate embodiment is illustrated by the flow chart shown in FIG. 10. In functional block 90, a primary circuit board is provided. In functional block 91, a g-sensor is rotated about an axis which is perpendicular to the primary circuit board by a predetermined angle α such that the silicon beam contained in the g-sensor is perpendicular to the vehicle direction of travel VT. The g-sensor is attached to the primary circuit board in functional block 92. The primary circuit board is then mounted in a housing in functional block 93.

While the invention has been described in terms of a longitudinal g-sensor for an ABS, the invention is also applicable to lateral g-sensors and vertical g-sensors. A lateral sensor would be mounted with the silicon beam lying in a vertical plane with a face perpendicular to the lateral axis 14 of the vehicle 10 (not shown) for sensing lateral acceleration forces. Similarly, a vertical g-sensor would be mounted with the silicon beam lying in a horizontal plane with a face perpendicular to the vertical axis 16 of the vehicle 10 (not shown) for sensing vertical acceleration forces. These g-sensors could be used as part of a vehicle stability management system. For example, a lateral g-sensor could be used for active roll stabilization. A vertical g-sensor could be used for a smart suspension system. Two or three different types of g-sensor could be used together in a vehicle. Additionally, while the preferred embodiment of the invention has been illustrated and described for a four wheel drive vehicle, it will be appreciated that the invention also can be practiced for two wheel drive vehicles. Furthermore, while the preferred embodiment has been illustrated and described for a control module used with an anti-lock brake system, it will be appreciated that the invention also can be practiced with control module for other systems, such as, for example, a traction control system control module.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A control module mounted upon a vehicle having a primary axis comprising:

a housing mounted upon the vehicle;

a primary circuit board disposed within said housing, said primary circuit board including an edge and defining a primary circuit board plane;

a secondary circuit board mounted upon said primary circuit board, said secondary circuit board being perpendicular to said primary circuit board, said secondary circuit board oriented upon said primary circuit board to define a first angle with said edge of said primary circuit board plane; and an acceleration sensor mounted upon said secondary circuit board, said sensor including an acceleration measuring element, said sensor having an edge and being mounted upon said secondary circuit board and defining a second angle between said acceleration sensor edge and said primary circuit board plane with said first and second angles each being greater than zero and being selected such that said measuring element lies in a plane which is perpendicular to said vehicle primary axis.

2. A control module according to claim 1 wherein said primary vehicle axis is a longitudinal axis of the vehicle.

3. A control module according to claim 1 wherein said primary vehicle axis is a lateral axis of the vehicle.

4. A control module according to claim 1 wherein said primary vehicle axis is a vertical axis of the vehicle.

5. A control module according to claim 1 wherein the control module is included in an anti-lock brake system.

6. A control module according to claim 1 wherein the control module is included in a traction control system.

7. A control module mounted upon a vehicle having a primary axis comprising:

a housing mounted upon the vehicle;

a primary circuit board disposed within said housing, said primary circuit board defining a primary circuit board plane;

a secondary circuit board mounted upon said primary circuit board, said secondary circuit board defining a secondary circuit board plane, said secondary circuit board plane intersecting said primary circuit board plane to define a line of intersection between said primary and secondary circuit board planes, said primary and secondary circuit board planes defining a first angle between said primary and secondary circuit board planes; and an acceleration sensor mounted upon said secondary circuit board, said acceleration sensor including an acceleration measuring element, said acceleration sensor having an edge and being mounted upon said secondary circuit board defining a second angle between said acceleration sensor edge and said line of intersection between said primary and secondary circuit board planes, said first and second angles each being greater than zero and being selected such that said acceleration measuring element is perpendicular to said primary vehicle axis.

8. A control module according to claim 7 wherein said primary vehicle axis is a longitudinal axis of the vehicle.

9. A control module according to claim 7 wherein said primary vehicle axis is a lateral axis of the vehicle.

10. A control module according to claim 7 wherein said primary vehicle axis is a vertical axis of the vehicle.

11. A control module according to claim 7 wherein the control module is included in an anti-lock brake system.

12. A control module according to claim 7 wherein the control module is included in a traction control system.

* * * * *